(12) United States Patent
Hung et al.

(10) Patent No.: US 8,965,006 B2
(45) Date of Patent: Feb. 24, 2015

(54) DE-POP CONTROLLER AND METHOD THEREOF

(75) Inventors: Guo-Kiang Hung, Hsinchu Hsien (TW); Tso Min Chen, Hsinchu Hsien (TW)

(73) Assignee: MStar Semiconductor, Inc., Taiwan (TW)

( * ) Notice: Subject to any disclaimer, the term of this patent is extended or adjusted under 35 U.S.C. 154(b) by 798 days.

(21) Appl. No.: 12/790,025

(22) Filed: May 28, 2010

(65) Prior Publication Data

US 2010/0308917 A1 Dec. 9, 2010

(30) Foreign Application Priority Data

Jun. 3, 2009 (TW) .............................. 098118357 A

(51) Int. Cl.
*H04B 15/00* (2006.01)
*H03G 3/34* (2006.01)

(52) U.S. Cl.
CPC ..................................... *H03G 3/348* (2013.01)
USPC ............................................................ 381/94.5

(58) Field of Classification Search
CPC ..... H04R 19/005; H04R 2460/03; H04R 3/00
USPC ............. 381/94.1–94.5, 120, 94.6, 94.8, 121, 381/123, 116, 117; 330/278, 124 R, 149, 51, 330/252, 253
See application file for complete search history.

(56) References Cited

U.S. PATENT DOCUMENTS

| | | | |
|---|---|---|---|
| 5,796,303 A * | 8/1998 | Vinn et al. ....................... | 330/51 |
| 6,346,854 B1 * | 2/2002 | Heithoff ......................... | 330/149 |
| 7,167,569 B1 * | 1/2007 | Seven ............................. | 381/111 |
| 7,463,742 B2 * | 12/2008 | Inagaki .......................... | 381/94.5 |
| 2005/0285671 A1 * | 12/2005 | Chang et al. .................... | 330/51 |

FOREIGN PATENT DOCUMENTS

| TW | I238016 | 8/2005 |
|---|---|---|
| TW | I377774 | 11/2012 |

* cited by examiner

*Primary Examiner* — Lun-See Lao
(74) *Attorney, Agent, or Firm* — Han IP Corporation

(57) ABSTRACT

A de-pop controller and method thereof are provided. The controller includes an amplifier and a comparator. The amplifier receives and amplifies an audio input signal, and then outputs an audio output signal. The comparator, coupled to the amplifier, receives a transient indication signal. The comparator compares the transient indication signal with a reference voltage, and the comparison result is then applied to control the driving ability of the amplifier for de-popping.

18 Claims, 4 Drawing Sheets

DE-POP CONTROLLER AND METHOD THEREOF

CROSS REFERENCE TO RELATED PATENT APPLICATIONS

This patent application claims priority from Taiwan Patent Application No. 098118357, filed in the Taiwan Patent Office on Jun. 3, 2009, entitled "De-Pop Controller and Method Thereof", and incorporates the Taiwan patent application in its entirety by reference.

TECHNICAL FIELD

The present disclosure relates to an audio circuit and associated method, and more particularly to a de-pop circuit and associated method.

BACKGROUND OF THE PRESENT DISCLOSURE

An audio amplifier amplifies a low-power audio signal to drive a transducer, such as a speaker. The audio amplifier is an OP amplifier, whose driving ability can be adjusted. For example, when the audio amplifier drives a low-impedance apparatus, the driving ability of the OP amplifier should be increased in order to reduce its total harmonic distortion (THD).

When the audio amplifier is at a transient state of power on/off, since charging and discharging rates of capacitors in the circuit are various, unpleasant pop noise often occurs. A conventional audio amplifier is designed with consideration of an impedance range for driving a speaker. Driving abilities for a low-impedance speaker and a high-impedance speaker are different. As the driving ability of the OP amplifier increases, the pop noise becomes more serious. Conversely, as the driving ability of the OP amplifier decreases, the high-impedance speaker cannot be driven properly so that the THD gets greater. In other words, by merely adjusting the driving ability of the OP amplifier in the audio amplifier, problems of the THD and the pop noise of the audio amplifier cannot be simultaneously solved. The pop noise gets worse as the THD becomes smaller, whereas the THD becomes greater when the pop noise is reduced.

Since the conventional audio amplifier cannot reduce the THD and remove the pop noise simultaneously, a novel audio circuit or controller is urgently needed for achieving both objects of de-popping and reducing the THD.

SUMMARY OF THE PRESENT DISCLOSURE

An object of the present disclosure is to provide a de-pop circuit and an associated method to de-pop effectively without increasing a THD.

The present disclosure provides a de-pop controller comprising an amplifier, a comparator, a timing control circuit and a signal bypass circuit. The amplifier receives an audio input signal, amplifies the audio input signal, and then outputs an audio output signal. The timing control circuit generates a transient indication signal. The comparator is coupled to the amplifier and receives the transient indication signal. The comparator compares the transient indication signal with a reference voltage to generate a comparison signal for controlling a driving ability of the amplifier. The signal bypass circuit bypasses the audio output signal to a ground during a power on/off transient period or a mute period.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF THE PREFERRED EMBODIMENT

Figure 1:
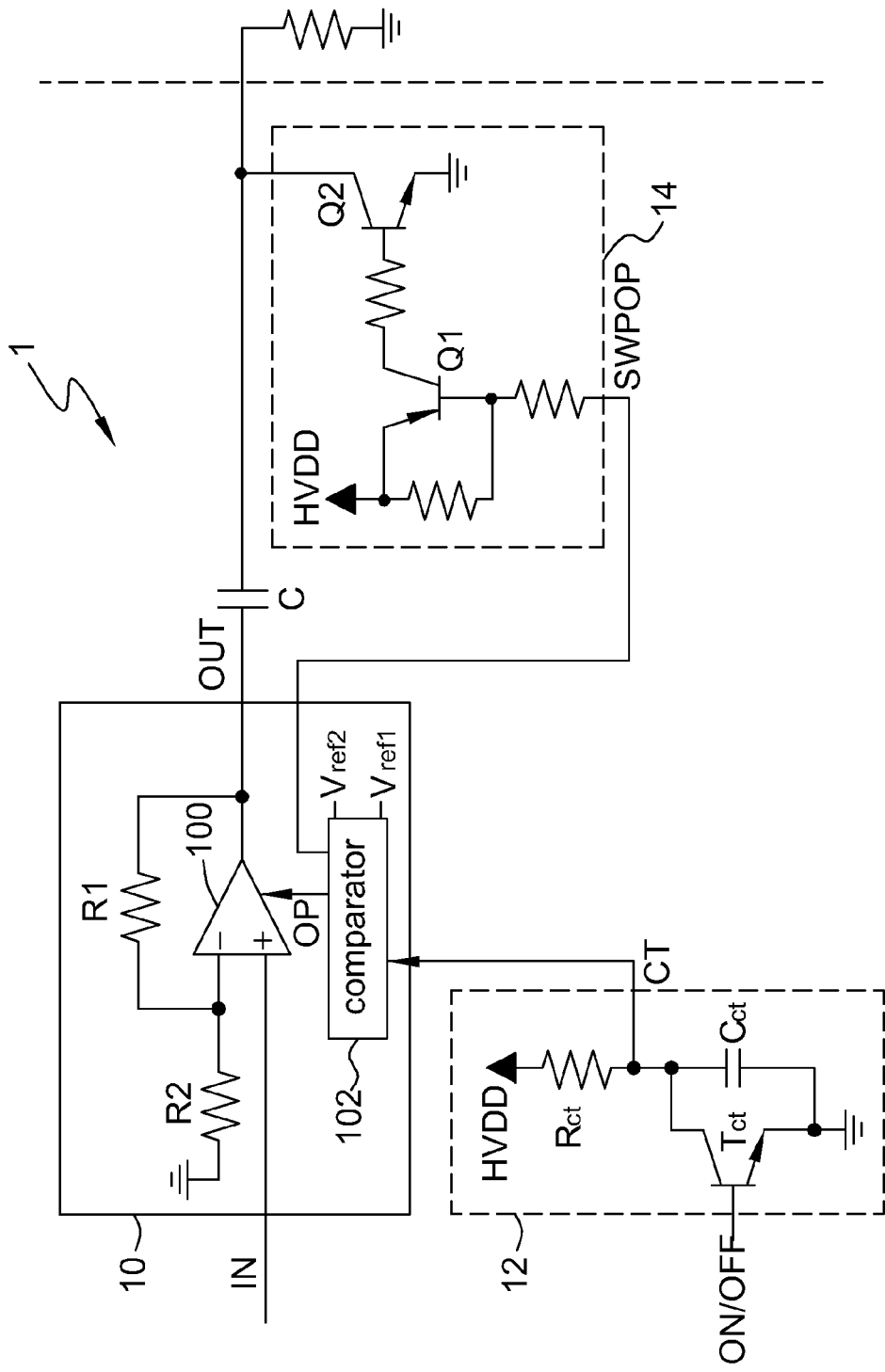
FIG. 1 shows a de-pop circuit according to one embodiment of the present disclosure.
Figure 2A:
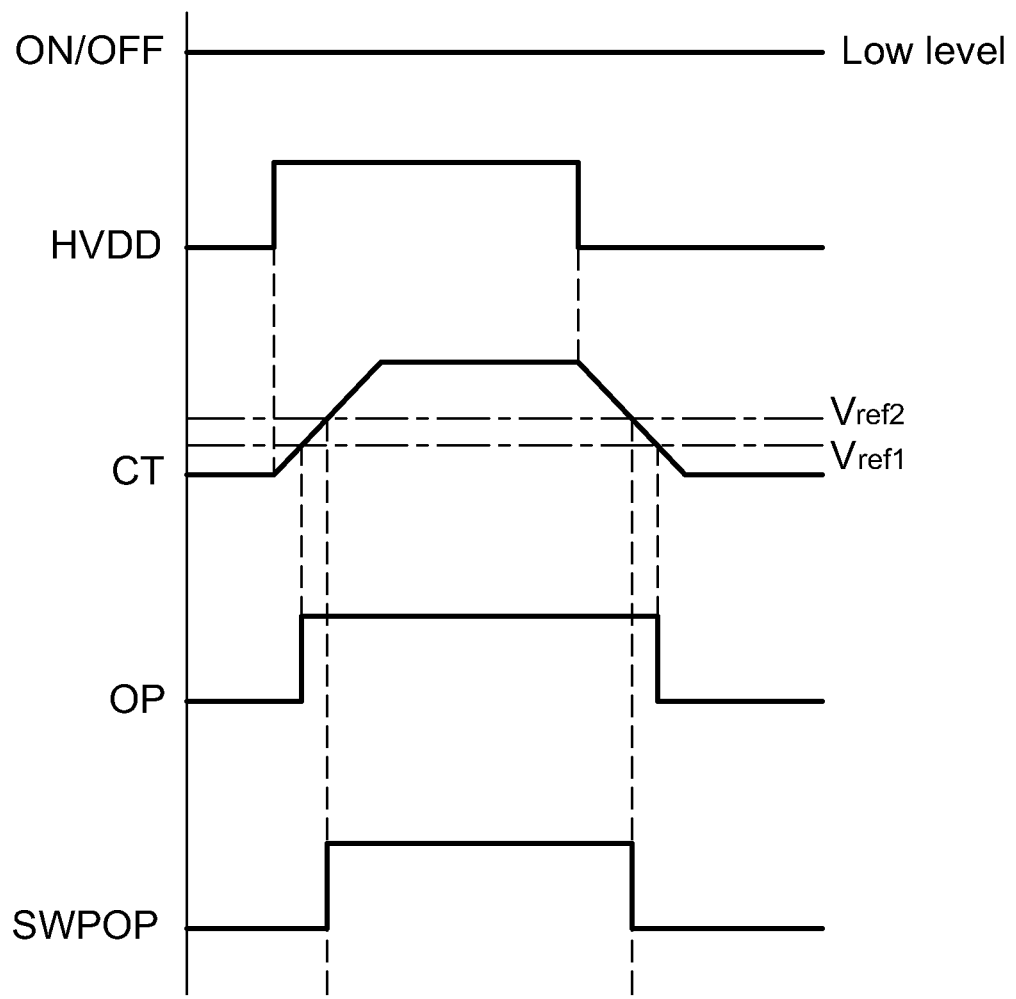
FIG. 2A is a waveform diagram of associated signals according to one embodiment of the present disclosure.

FIG. 1 shows a de-pop circuit 1 according to one embodiment of the present disclosure. FIG. 2A is a waveform diagram of associated signals. In this embodiment, the de-pop circuit 1 comprises a de-pop controller 10. The controller 10 can be implemented as one single integrated circuit or be integrated with other circuits into a same integrated circuit.

In this embodiment, the controller 10 comprises an OP amplifier 100 and a comparator 102. The OP amplifier 100 receives through an input pin IN an audio input signal, which is amplified to an audio output signal to be outputted via an output pin OUT. In the circuit 1 illustrated in FIG. 1, a resistor R1 is coupled between an output end and an inverting input end (−) of the OP amplifier 100. Another resistor R2 is coupled between the inverting input end and ground. The audio input signal enters a non-inverting input end (+) of the OP amplifier 100. However, the present disclosure does not limit the OP amplifier to such connection and arrangement illustrated in FIG. 1.

The comparator 102 receives a transient indication signal CT through a control pin. With reference to FIG. 2A, regarding the transient indication signal CT, a low level (or a first level) voltage indicates an audio circuit is under a transient period of power on/off, a high level (or a second level) voltage indicates the audio circuit is under a stable, normal operating period, and a signal slope from the low level to the high level covers a transient period from power off to power on. By selecting a resistor $R_{CT}$ and a capacitor $C_{CT}$ connected in series in a timing control circuit 12, charging/discharging rate is adjusted to generate the transient indication signal CT with various slopes. The timing control circuit 12 expands a steep-slope transient signal of a power HVDD shown in FIG. 2A to a gradual-slope signal, such as the transient indication signal CT. In this embodiment, the capacitor $C_{CT}$ in the timing control circuit 12 can connect in parallel to a switch transistor $T_{CT}$, e.g., an npn bipolar junction transistor that can be controlled by a front-end circuit (not shown), e.g., a digital television control chip, to determine whether to activate the timing control circuit 12. For example, when the base of the switch transistor $T_{CT}$ receives a high level control signal, the timing control circuit 12 quickly discharges the transient indication signal CT to low level to disable audio amplification of the controller 10. When the base of the switch transistor $T_{CT}$ receives a low level control signal, the timing control circuit 12 is activated to charge/discharge the transient indication signal CT.

FIG. 2A is a waveform diagram of associated signals of the circuit shown in FIG. 1. The comparator 102 compares the transient indication signal CT with a predetermined reference voltage, such as a first reference voltage $V_{ref1}$ shown in the figure. When the transient indication signal CT is smaller than the first reference voltage $V_{ref1}$, that is, during the power on/off transient period, the comparator 102 outputs a low level driving control signal OP to reduce the driving ability (e.g., an output slew rate) of the OP amplifier 100. When the transient indication signal CT is greater than the first reference voltage $V_{ref1}$, that is, during the normal operating period after power on or before power off, the comparator 102 outputs a high level driving control signal OP to increase the driving ability of the OP amplifier 100. Persons skilled in the art can make various possible modifications according to the above disclosure. For example, the comparator 102 can compare an input signal with multiple first reference voltages to generate a multiple-bit output to adjust the driving ability of the OP amplifier 100.

Further, the comparator 102 compares the transient indication signal CT with another predetermined reference voltage, such as a second reference voltage $V_{ref2}$ shown in FIG. 2A. When the transient indication signal CT is smaller than the second reference voltage $V_{ref2}$, that is, during the power on/off transition period, the controller 10 also outputs a low level de-pop switch signal SWPOP through a general purpose input/output (GPIO) pin or a dedicated pin, for example, to control a signal bypass circuit 14 via the de-pop switch signal SWPOP. For example, transistors Q1 and Q2 are activated, so that an audio output signal OUT (from the pin OUT) is bypassed to ground but not to an output apparatus (or a load). By doing so, the pop noise generated by a transient signal can be effectively reduced or even removed. In the circuit illustrated in FIG. 1, the signal bypass circuit 14 comprises the transistors Q1 and Q2, and a plurality of resistors. When the transient indication signal CT is greater than the second reference voltage $V_{ref2}$, the comparator 102 outputs a high level de-pop switch signal SWPOP to turn off the transistors Q1 and Q2. Thus, the signal bypass circuit 14 is disabled so that the audio output signal OUT is outputted via a normal path, such as being outputted to the output apparatus or the load (e.g., a speaker) via a coupling capacitor C shown in the diagram. In this embodiment, the first reference voltage $V_{ref1}$ and the second reference voltage $V_{ref2}$ are applied to generate the driving control signal OP and the de-pop switch signal SWPOP respectively. However, in other embodiments, same reference voltages can be used, which shall also generate the same driving control signal OP and the de-pop switch signal SWPOP. When different reference voltages are applied, such as when the first reference voltage $V_{ref1}$ and the second reference voltage $V_{ref2}$ different from each other are applied, since the audio output signal OUT is not yet stable during the power on/off transition period, the audio output signal OUT is grounded through the low level de-pop switch signal SWPOP to further prevent the pop noise.

According to the above embodiment, during the power on/off transient period, or a de-pop period, the OP amplifier 100 reduces its driving ability via the low level driving control signal OP to yield a better de-pop effect. During the normal operating period after power on or before power off, the OP amplifier 100 increases its driving ability via the high level driving control signal OP to reduce its total harmonic distortion (THD). In other words, the present disclosure is capable of tending both audio controls of de-popping and reducing the THD.

Figure 2B:
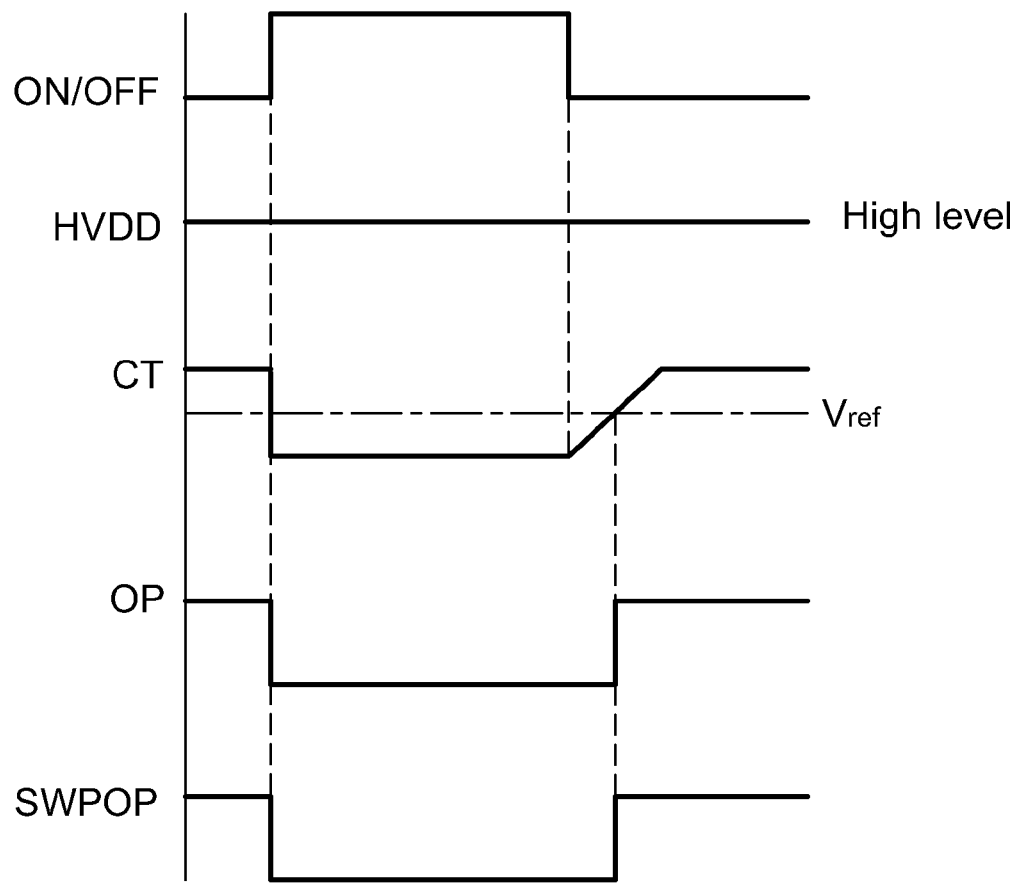
FIG. 2B is a waveform diagram of associated signals according to another embodiment of the present disclosure.

FIG. 2B is a waveform diagram of associated signals in the circuit illustrated in FIG. 1 according to another embodiment of the present disclosure, by which the pop noise during a mute operation can be de-popped. When one switches between television (TV) channels, the TV frequently needs to mute and restore the volume, and the pop noise can be effectively removed with the embodiment circuit shown in FIG. 1. For example, when a TV chip (not shown) receives a switch channel command, an ON/OFF control signal shown in FIG. 1 is asserted, as shown in FIG. 2B. With reference to FIG. 1 and FIG. 2B, when the ON/OFF control signal is pulled up from a low level to a high level by assertion, the transistor $T_{CT}$ is grounded, and the transient indication signal CT is rapidly pulled down to the low level. Thus, the driving control signal OP quickly decreases the driving ability of the OP amplifier 100, and the de-pop switch signal SWPOP is also pulled down to the low level to swiftly activate the signal bypass circuit 14 to prevent the pop noise. After a predetermined time, e.g., a system manufacturer defined period, when the assertion of the ON/OFF control signal ends, that is, when the high level of the ON/OFF control signal is pulled down to the low level, the transistor $T_{CT}$ is turned off, and the transient indication signal CT is charged slowly via the capacitor $C_{CT}$ till it exceeds the reference voltage $V_{ref}$. In the mean time, an audio input also stabilizes. The driving ability of the OP amplifier 100 increases, and the de-pop switch signal SWPOP turns off the signal bypass circuit 14 to normally drive a speaker output, thereby preventing the pop noise. Alternatively, if the same reference voltage is applied, the generated driving control signal OP and the de-pop switch signal SWPOP can be the same. Alternatively, in another embodiment, different reference voltages can be applied. With reference to FIG. 2A, the first reference voltage $V_{ref1}$ and the second reference voltage $V_{ref2}$ that are different from each other are applied, so as to assert the driving control signal OP and the de-pop switch signal SWPOP at different time points.

Figure 3:
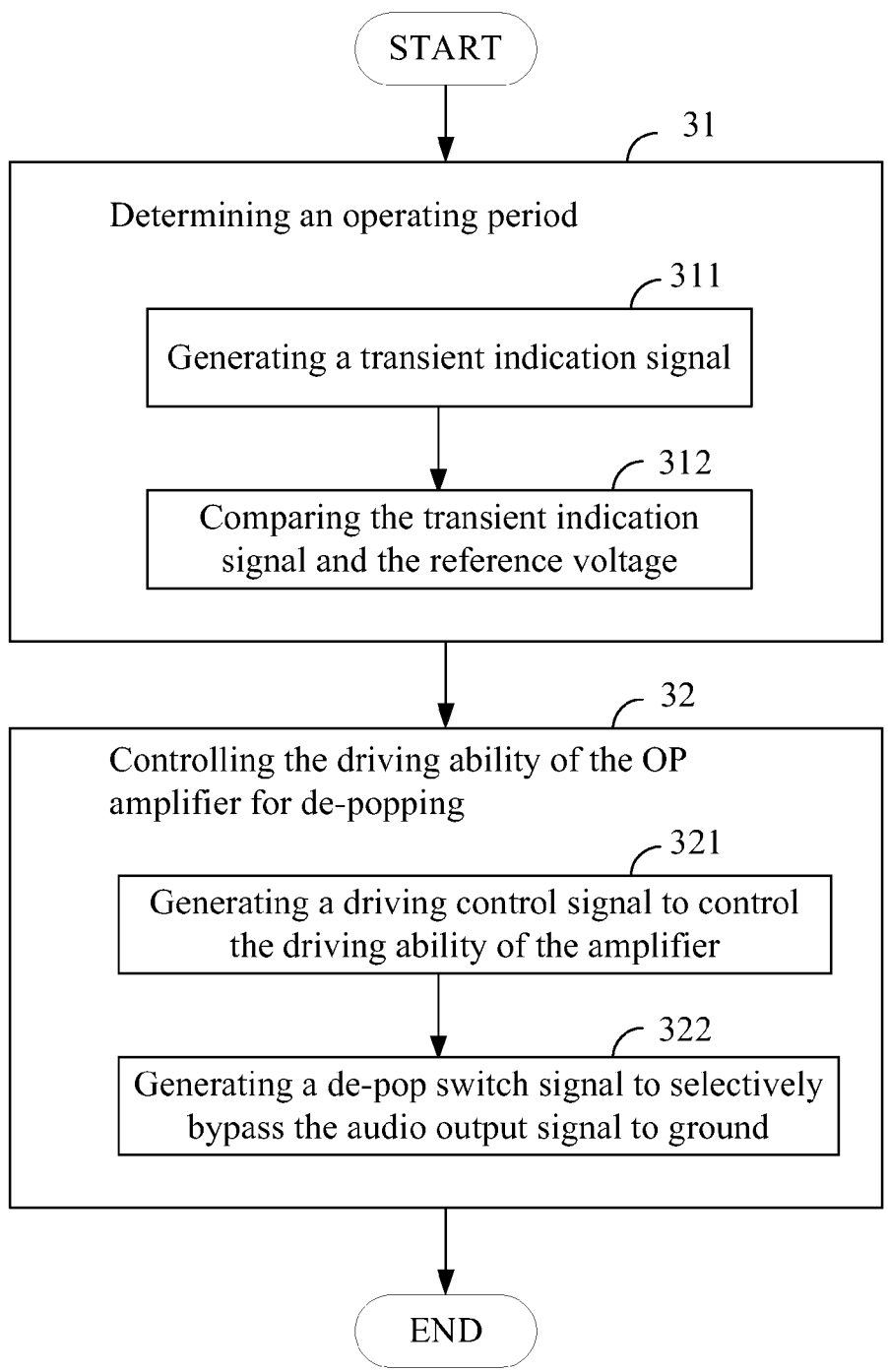
FIG. 3 illustrates a flowchart of a de-pop method according to one embodiment of the present disclosure.

FIG. 3 is a flowchart of a de-pop method according to one embodiment of the present disclosure. The method begins with Step 31 to determine an operating period. In one embodiment, as shown in FIG. 2A, the operating period comprises a power on/off transient period and a normal operating period. Alternatively, as shown in FIG. 2B, the operating period comprises a mute period and a non-mute period when one switches between channels.

In this embodiment, as shown in FIG. 2A, the determining step 31 comprises Step 311 and Step 312. In Step 311, the timing control circuit 12 expands a steep-slope signal of the transient state of the power HVDD to generate a gradual-slope signal of the transient indication signal CT. In Step 312, the comparator 102 compares the transient indication signal CT with the reference voltage, e.g., the first reference voltage $V_{ref1}$, to determine whether the transient indication signal CT occurs during a power on/off transient period or a normal operating period. When the transient indication signal CT is less than the first reference voltage $V_{ref1}$, it is determined as during the power on/off transient period. Otherwise it is determined as during the normal operating period.

In another embodiment, as shown in FIG. 2B, the determining step 31 comprises Step 311 and Step 312 to be described below. In Step 311, the transient indication signal CT is generated by the ON/OFF control signal. When the ON/OFF control signal is pulled up from the low level to the high level by assertion, the transient indication signal CT is pulled down to the low level rapidly. When the ON/OFF control signal is de-asserted, the transient indication signal CT is charged slowly by the capacitor $C_{CT}$ till it exceeds the reference voltage. In Step 312, the transient indication signal CT and the reference voltage $V_{ref}$ are compared by the comparator 102 to determine whether the transient indication signal CT is during a mute period or a non-mute period. When the transient indication signal CT is less than the reference voltage $V_{ref}$, it is determined as during the mute period, or otherwise it is determined as during the non-mute period.

Next, in Step 32, according to the different periods, the driving ability of the OP amplifier 100 is properly controlled for de-popping. In one embodiment, as shown in FIG. 2A, the Step 32 comprises Step 321 and Step 322 to be described below. First, in Step 321, the transient indication signal CT and the reference voltage, e.g., the first reference voltage $V_{ref1}$, are compared by the comparator 102 to generate the driving control signal OP. For example, during the power on/off transient period, the driving control signal OP is low to reduce the driving ability of the OP amplifier 100, and during the normal operating period, the driving control signal OP is high to increase the driving ability. In Step 322, the transient indication signal CT and the reference voltage, e.g., the second reference voltage $V_{ref2}$, are compared by the comparator 102 for controlling the de-pop switch signal SWPOP. The de-pop switch signal SWPOP is capable of selectively bypassing the audio output signal to ground. For example, during the power on/off transient period, the de-pop switch signal SWPOP is low to bypass the audio output signal to ground to de-pop or reduce the pop noise. During the normal operating period, the de-pop switch signal SWPOP is high to output the audio output signal through the normal path, such as outputting the audio output signal to the output apparatus (or the load) via the coupling capacitor C shown in FIG. 1.

In another embodiment, as shown in FIG. 2B, the Step 32 comprises Step 321 and Step 322 to be described below. In Step 321, the transient indication signal CT and the reference voltage $V_{ref}$ are compared by the comparator 102 to generate the driving control signal OP. For example, the level of the transient indication signal CT is rapidly pulled down by turning on the switch transistor $T_{CT}$ to reduce the driving ability of the amplifier during the mute period, and the driving control signal OP is high to increase the driving ability during the non-mute period. In Step 322, the transient indication signal CT and the reference voltage $V_{ref}$ are compared by the comparator 102 to control the de-pop switch signal SWPOP. For example, the de-pop switch signal SWPOP is low to bypass the audio output signal to ground to de-pop during the mute period, and the de-pop switch signal SWPOP is high to output the audio output signal through the normal path during the non-mute period, such as outputting the audio output signal to the output apparatus (or the load) via the coupling capacitor C shown in FIG. 1. Steps 321 and 322 can be performed in a reverse order or performed at the same time.

To sum up, the present disclosure provides a de-pop audio controller comprising an amplifier and a comparator coupled to the amplifier. The amplifier receives an audio input signal and then amplifies the audio input signal to output an audio output signal. The comparator receives a transient indication signal via a control pin. The comparator compares the transient indication signal with a reference voltage to generate a comparison signal for controlling a driving ability of the amplifier.

The present disclosure further provides a de-pop method, comprising steps as follows. A transient indication signal is provided to indicate an operating period. For example, the transient indication signal indicates a power on/off transition period and a normal operating period. Alternatively, the transient indication signal indicates a mute period and a non-mute period. The step of generating the transient indication signal expands a steep-slope transient signal from the power on/off transient period to a gradual-slope transient indication signal. A driving control signal is generated in response to the transient indication signal to control the driving ability of the amplifier to de-pop. For example, the driving control signal is generated by comparing the transient indication signal with a reference voltage. The driving ability of the amplifier is decreased when the driving control signal is at a first level, and increased when the driving control signal is at the second level. For example, the level of the transient indication signal is rapidly pulled down by turning on a switch transistor during the mute period to decrease the driving ability of the amplifier. For example, the de-pop switch signal is generated by comparing the transient indication signal with another reference voltage to selectively bypass the audio output signal to a ground. Preferably, the level of the another reference voltage is higher than the level of the reference voltage.

While the present disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A de-pop controller, comprising:
    an amplifier that receives an audio input signal and amplifies the audio input signal to output an audio output signal;
    a comparator, coupled to the amplifier, that receives a transient indication signal and compares the transient indication signal with a reference voltage to generate a comparison signal that controls a driving ability of the amplifier; and
    a timing control circuit that generates the transient indication signal, the timing control circuit comprising:
        a resistor and a capacitor serially connected between a power source and an electrical ground; and
        a transistor connected in parallel with the capacitor and controlled by a front-end circuit to selectively activate the timing control circuit.

2. The controller according to claim 1, wherein the amplifier comprises an input pin and an output pin, and receives the audio input signal through the input pin and outputs the audio output signal through the output pin.

3. The controller according to claim 2, further comprising a control pin via which the comparator receives the transient indication signal.

4. The controller according to claim 1, wherein the transient indication signal indicates a power on/off transient period and a normal operating period.

5. The controller according to claim 1, wherein the transient indication signal indicates a mute period and a non-mute period.

6. The controller according to claim 1, wherein the timing control circuit expands a steep-slope transient signal of the power to a gradual-slope signal of the transient indication signal.

7. The controller according to claim 1, wherein the driving ability of the amplifier is decreased when the comparison signal is at a first level, and increased when the comparison signal is at a second level.

8. The controller according to claim 3, wherein the output pin is coupled to a signal bypass circuit that bypasses the audio output signal to an electrical ground.

9. The controller according to claim 8, wherein the comparator further generates a de-pop switch signal by comparing the transient indication signal with another reference voltage to control the signal bypass circuit to selectively bypass the audio output signal to the ground.

10. The controller according to claim 1, wherein:
the comparator generates a first level comparison signal that decreases the driving ability of the amplifier in response to the transient indication signal being smaller than a first reference voltage; and
the comparator generates a second level comparison signal that increases the driving ability of the amplifier in response to the transient indication signal being greater than the first reference voltage.

11. A de-pop method, comprising:
generating, by a timing control circuit, a transient indication signal associated with an operating period; and
generating a driving control signal in response to the transient indication signal that controls a driving ability of an amplifier,
wherein the timing control circuit comprises:
a resistor and a capacitor serially connected between a power source and an electrical ground; and
a transistor connected in parallel with the capacitor and controlled by a front-end circuit to selectively activate the timing control circuit.

12. The method according to claim 11, wherein the transient indication signal indicates a power transition period and a normal operating period.

13. The method according to claim 11, wherein the transient indication signal indicates a mute period and a non-mute period.

14. The method according to claim 11, wherein generating the transient indication signal expands a steep-slope transient signal during a power on/off transient period to a gradual-slope transient indication signal.

15. The method according to claim 11, wherein generating the driving control signal generates the driving control signal by comparing the transient indication signal with a reference voltage.

16. The method according to claim 11, wherein the driving ability of the amplifier is decreased when the driving control signal is at a first level, and increased when the driving control signal is at a second level.

17. The method according to claim 11, wherein generating the driving control signal generates the driving control signal by comparing the transient indication signal with a reference voltage, and generates a de-pop switch signal by comparing the transient indication signal with another reference voltage.

18. The method according to claim 17, wherein the de-pop switch signal selectively bypasses an audio output signal to an electrical ground.

\* \* \* \* \*